United States Patent
Al-Shyoukh et al.

(10) Patent No.: US 10,397,025 B2
(45) Date of Patent: Aug. 27, 2019

(54) RECEIVER ARCHITECTURE FOR DIGITAL ISOLATORS EMPLOYING NOTCH FILTERS COMMON MODE TRANSIENT IMMUNITY

(71) Applicant: Silicon Laboratories Inc., Austin, TX (US)

(72) Inventors: Mohammad Al-Shyoukh, Cedar Park, TX (US); Stefan Mastovich, Round Rock, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 15/683,873

(22) Filed: Aug. 23, 2017

(65) Prior Publication Data

US 2019/0068410 A1 Feb. 28, 2019

(51) Int. Cl.

| | |
|---|---|
| *H04L 25/02* | (2006.01) |
| *H03H 7/01* | (2006.01) |
| *H03H 7/06* | (2006.01) |
| *H03H 11/04* | (2006.01) |
| *H03H 11/38* | (2006.01) |
| *H04B 1/10* | (2006.01) |
| *H04L 25/08* | (2006.01) |
| *H04L 27/06* | (2006.01) |

(52) U.S. Cl.
CPC ....... *H04L 25/0294* (2013.01); *H03H 7/0161* (2013.01); *H03H 7/06* (2013.01); *H03H 11/04* (2013.01); *H03H 11/38* (2013.01); *H04B 1/1036* (2013.01); *H04L 25/08* (2013.01); *H03H 2007/013* (2013.01); *H03H 2011/0488* (2013.01); *H04B 2001/1063* (2013.01); *H04L 27/06* (2013.01)

(58) Field of Classification Search
CPC ..... H04L 25/0294; H04L 25/08; H04L 27/06; H04B 1/1036; H03H 7/0161; H03H 7/06; H03H 11/04; H03H 11/38
USPC ......................................... 375/320
See application file for complete search history.

(56) References Cited

U.S. PATENT DOCUMENTS

| | | | | |
|---|---|---|---|---|
| 4,312,064 | A | * | 1/1982 | Bench ........... H04J 1/08 370/477 |
| 4,916,538 | A | * | 4/1990 | Carver .......... H04N 5/208 348/540 |

(Continued)

*Primary Examiner* — Michael R Neff
(74) *Attorney, Agent, or Firm* — Zagorin Cave LLP (57) ABSTRACT

A technique for attenuating common mode transient events uses a differential receiver circuit including a band-stop filter having a stopband $f_{SB}$ around a notch frequency $f_n$ of a received signal. The differential receiver circuit includes a first high-pass filter coupled in series with the band-stop filter. The notch frequency $f_n$ is less than a carrier frequency $f_c$ of a signal received by the differential receiver circuit. The band-stop filter may include a buffer circuit and a notch filter coupled in series with the buffer circuit. The notch filter may have a second stopband around the notch frequency $f_n$. The differential receiver circuit may have a propagation delay that is independent of a pulse width of common mode transient energy attenuated by the differential receiver circuit.

18 Claims, 12 Drawing Sheets

(56) References Cited

U.S. PATENT DOCUMENTS

| | | |
|---|---|---|
| 9,257,836 B2 | 2/2016 | Mills et al. |
| 2003/0103581 A1* | 6/2003 | Rawlins ................ H04B 1/30 375/319 |
| 2006/0152408 A1* | 7/2006 | Leinonen ............... G01S 19/21 342/357.59 |
| 2012/0178400 A1* | 7/2012 | Yu ..................... H03F 3/45188 455/341 |
| 2015/0171901 A1 | 6/2015 | Dupuis et al. |

* cited by examiner

SYMMETRY

RECEIVER ARCHITECTURE FOR DIGITAL ISOLATORS EMPLOYING NOTCH FILTERS COMMON MODE TRANSIENT IMMUNITY

BACKGROUND

Field of the Invention

The invention relates to isolation technology and more particularly to communication across an isolation channel.

Description of the Related Art

In a typical control application, a processor system provides one or more control signals for controlling a load system. During normal operation, a large DC or transient voltage difference may exist between the power domain of the processor system and the power domain of the load system, thus requiring an isolation barrier between the processor system and the load system. For example, one domain may be "grounded" at a voltage that is switching with respect to earth ground by hundreds or thousands of volts. Even when the expected voltage difference between the domains is small in normal operation, isolation increases safety in some applications. For example, in a biomedical application that includes electrodes taped to a patient's body, even if a measurement device is properly grounded, isolation increases protection of the patient.

Accordingly, an intermediate system includes isolation that prevents damaging currents from flowing between the processor system and the load system. Although the isolation prevents the processor system from being coupled to the load by a direct conduction path, an isolation channel allows communication between the two systems using optical (opto-isolators), capacitive, inductive (transformers), or electromagnetic techniques. However, such communication is susceptible to common mode transients that can interfere with the accuracy of the information transmitted across the isolation channel. Thus, isolation technology with immunity to common mode transients is desirable.

SUMMARY OF EMBODIMENTS OF THE INVENTION

In at least one embodiment of the invention, a differential receiver circuit includes a band-stop filter having a stopband $f_{SB}$ around a notch frequency $f_n$ of a received signal. The differential receiver circuit includes a first high-pass filter coupled in series with the band-stop filter. The notch frequency $f_n$ is less than a carrier frequency $f_c$ of a signal received by the differential receiver circuit. The band-stop filter may include a buffer circuit and a notch filter coupled in series with the buffer circuit. The notch filter may have a second stopband around the notch frequency $f_n$. The differential receiver circuit may have a propagation delay that is independent of a pulse width of common mode transient energy attenuated by the differential receiver circuit.

In at least one embodiment of the invention, a method of receiving a signal includes band-stop filtering a first version of a received signal to attenuate energy in a stopband $f_{SB}$ around a notch frequency $f_n$. The method includes high-pass filtering a second version of the received signal to attenuate energy below a carrier frequency $f_c$ of the received signal. The carrier frequency $f_c$ is higher than the notch frequency $f_n$. The band-stop filtering may include buffering and notch filtering the first version of the received signal. The notch filtering may attenuate energy in a second stopband around the notch frequency $f_n$. The method of receiving may have a propagation delay independent of events being attenuated.

In at least one embodiment of the invention, a differential receiver includes a first circuit configured to attenuate energy in a first frequency range of a frequency response of a received signal. The first frequency range is $f \leq f_c$, where $f$ is frequency and $f_c$ is a carrier frequency of the received signal. The differential receiver includes a second circuit coupled in series with the first circuit and configured to attenuate energy in a second frequency range of the frequency response of the received signal. The second frequency range is $f_n/k \leq f \leq (2 \times k \times f_n)$, where $f_n$ is a notch frequency of a notch filter included in a band-stop filter having a stopband around the notch frequency and k is a scaling factor. The differential receiver includes a third circuit coupled in series with the second circuit and configured to remove a carrier wave from an output of the second circuit and recover digital data encoded in the received signal using hysteretic thresholds.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
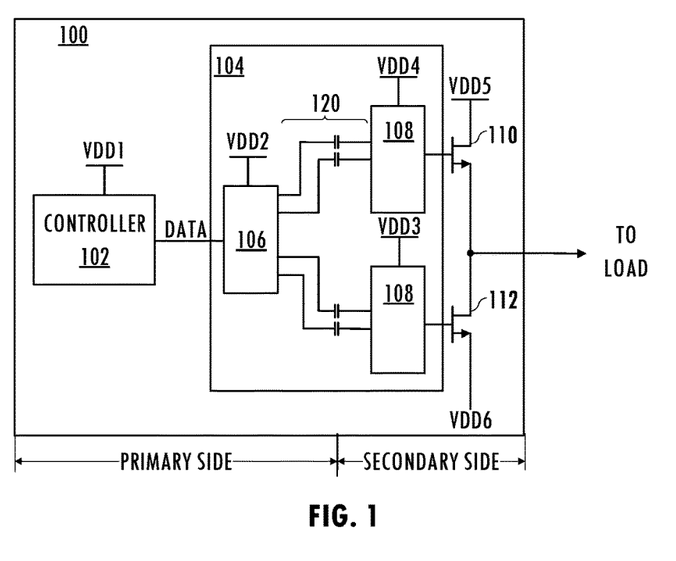
FIG. 1 illustrates a functional block diagram of an exemplary integrated circuit system including a capacitive isolation barrier.
Figure 2:
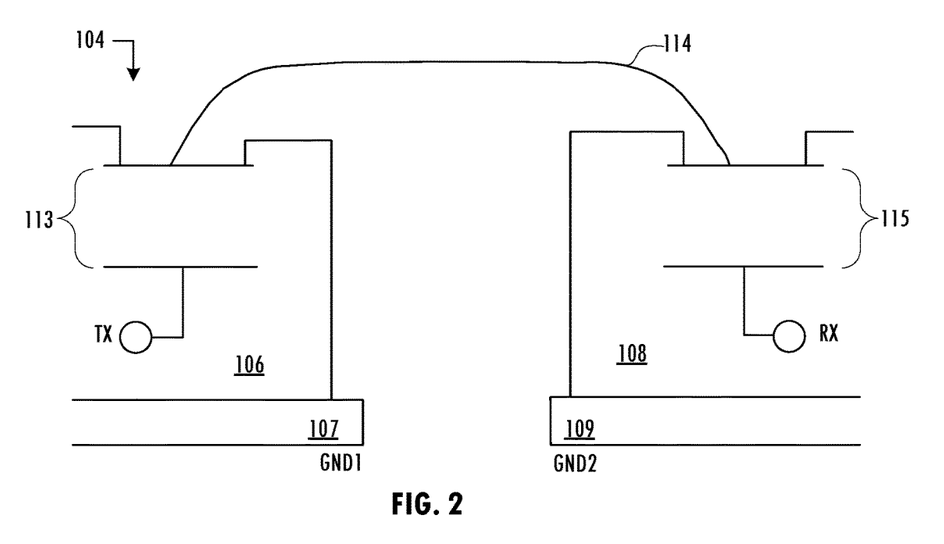
FIG. 2 illustrates a cross-sectional view of an exemplary packaged integrated circuit system including a capacitive isolation barrier.

Referring to FIGS. 1 and 2, in an exemplary application, controller 102, which may be a microprocessor, microcontroller, or other suitable processing device, operates in a first domain (i.e., a domain including VDD1, e.g., 5 Volts (V)) and provides one or more signals (e.g., DATA) for a load system operating in a second domain (i.e., a domain including VDD5 and VDD6, e.g., 150V and −150V, respectively) using digital isolator 104. Digital isolator 104 includes isolation channel 120, which may isolate the domains on a first side of system 100, e.g., the primary side including VDD1 (e.g., less than ten volts) and VDD2 (e.g., less than ten volts) and devices coupled thereto, and a second side of system 100, e.g., the secondary side including VDD3 and VDD4 (e.g., tens of volts) and VDD5 and VDD6 (e.g., hundreds of volts) and devices coupled thereto.

Isolation channel 120 facilitates safe communication of a signal received from controller 102 in the primary side to the secondary side. The secondary side includes driver circuitry (e.g., included in receiver circuits 108), which generates an output control signal based on the signal received from the primary side and provides a suitable drive signal to devices 110 and 112. In an exemplary embodiment, digital isolator 104 includes multiple integrated circuits configured as a multi-chip module in a single package. For example, digital isolator 104 includes a primary side integrated circuit (e.g., transmitter circuit 106) and a secondary side integrated circuit (e.g., receiver circuits 108). However, other embodiments of digital isolator 104 include one receiver circuit 108 or additional transmitter circuits 106 and/or additional receiver circuits 108. Transmitter circuit 106 and receiver circuit 108 include terminals that may be pins of corresponding packages included in a package of the multi-chip module. Those terminals may be coupled to external elements, e.g., transformers, discrete resistors, and discrete capacitors within the multi-chip module or to terminals of the package of the multi-chip module, and a package of controller 102. In other embodiments, transmitter circuit 106 is formed on a first integrated circuit die and receiver circuit 108 is formed on another integrated circuit die, both of which are attached to lead frame 107 and lead frame 109, respectively, and include terminals coupled to isolation channel 120 formed on the lead frame and packaged as a single device. In still other embodiments, transmitter circuit 106 and receiver circuit 108 include transmit and receive terminals, respectively, coupled to isolation channel 120, all of which are formed on an integrated circuit die. Isolation channel 120 allows safe communication of signals from controller 102 to receiver circuits 108, which drive devices 110 and 112 used to deliver power to a load system. Exemplary devices 110 and 112 include power metal-oxide-semiconductor field-effect transistors (MOSFETs), insulated-gate bipolar transistors (IGBTs), Gallium-Nitride (GaN) MOSFETs, Silicon-Carbide power MOSFETs, and other suitable devices able to deliver high power to loads.

In at least one embodiment of system 100, isolation channel 120 blocks DC signals and only passes AC signals. Isolation channel 120 is illustrated as including capacitive isolation, although other suitable isolation techniques may be used. Capacitors 113 and 115 may be integrated with transmitter circuit 107 and receiver circuit 109, respectively, and coupled to bondwire 114. For example, capacitors 113 and 115 include a bottom plate formed in a first conductive semiconductor layer (e.g., metal-1) and a top plate formed in a second conductive semiconductor layer (e.g., metal-7) above the first conductive semiconductor layer, with a dielectric material (e.g., silicon dioxide) formed between the top and bottom plates.

Figure 3:
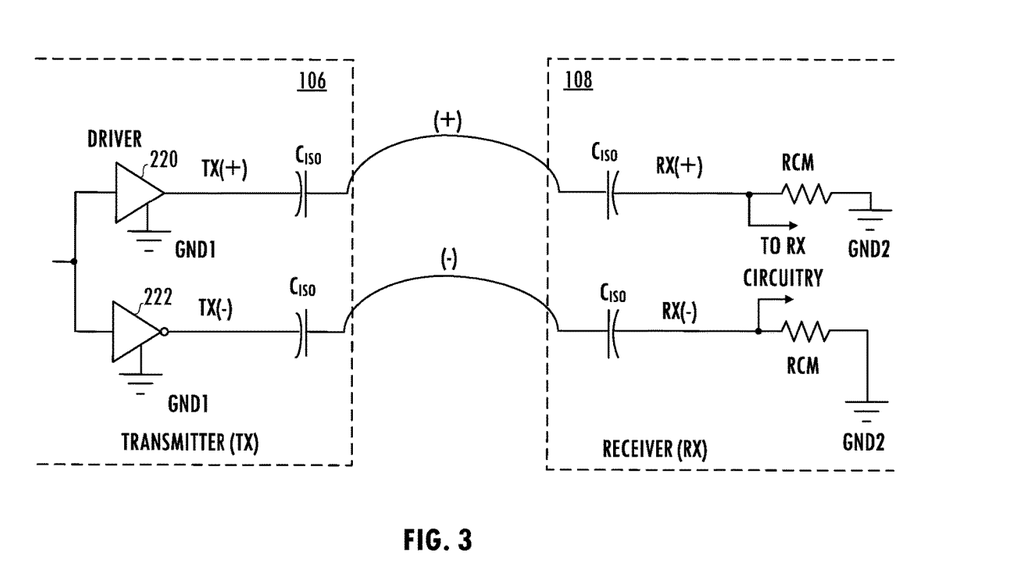
FIG. 3 illustrates a functional block diagram of an exemplary capacitive isolation channel of the integrated circuit system of FIG. 2.

An exemplary isolation channel 120 uses on-off keying modulation to communicate one or more digital signals (e.g., DATA) between transmitter circuit 106 and receiver circuit 108, although other communication protocols may be used. In general, on-off keying modulation is a form of amplitude-shift keying modulation that represents digital data as the presence or absence of a carrier wave or oscillating signal having a carrier frequency $f_c$ (e.g., 500 MHz-1 GHz). The presence of the carrier for a specified duration represents a binary one, while its absence for the same duration represents a binary zero. This type of signaling is robust for isolation applications because a logic '0' state sends the same signal (e.g., nothing) as when the primary side loses power and the device gracefully assumes its default state. That behavior is advantageous in driver applications because it will not accidentally turn on a device being driven, even when the primary side loses power. A typical digital isolator receives the digital signal from the processor system asynchronous to a clock internal to the isolator system.

Figure 4:
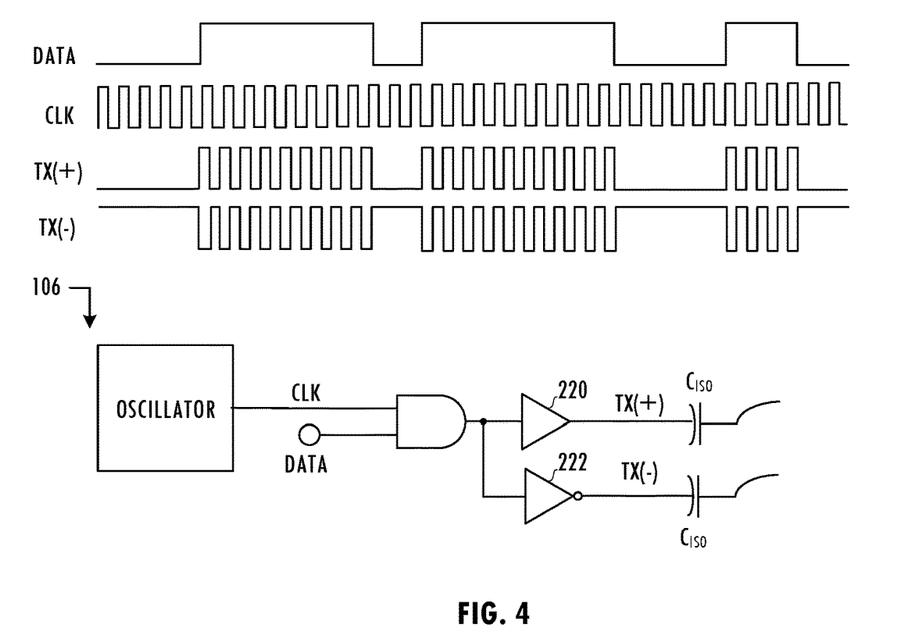
FIG. 4 illustrates a functional block diagram and associated waveforms for a transmitter of the integrated circuit system of FIG. 2.
Figure 5:
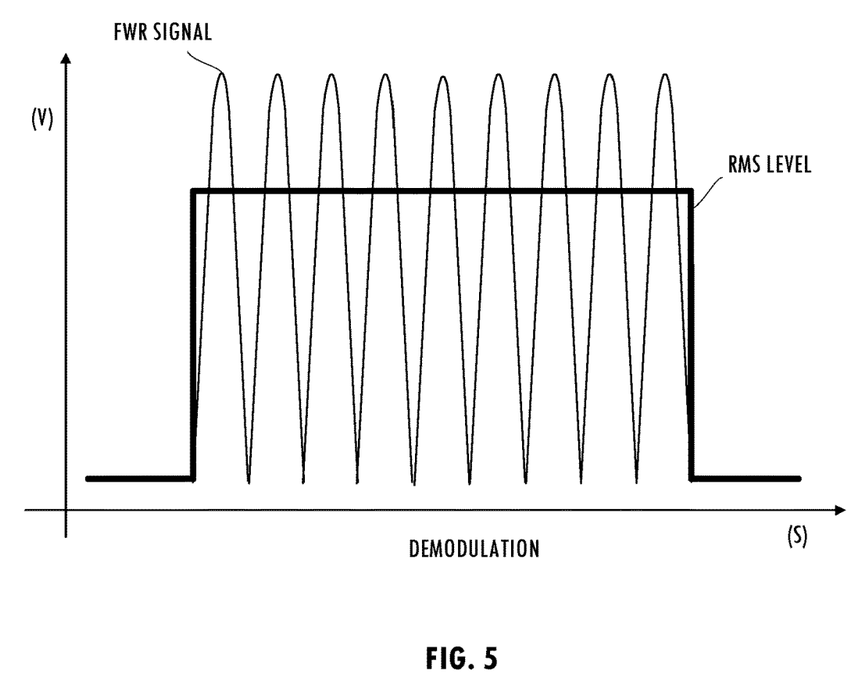
FIG. 5 illustrates waveforms for a signal received by a receiver of the integrated circuit system of FIG. 2 and a demodulated version of the received signal.
Figure 6:
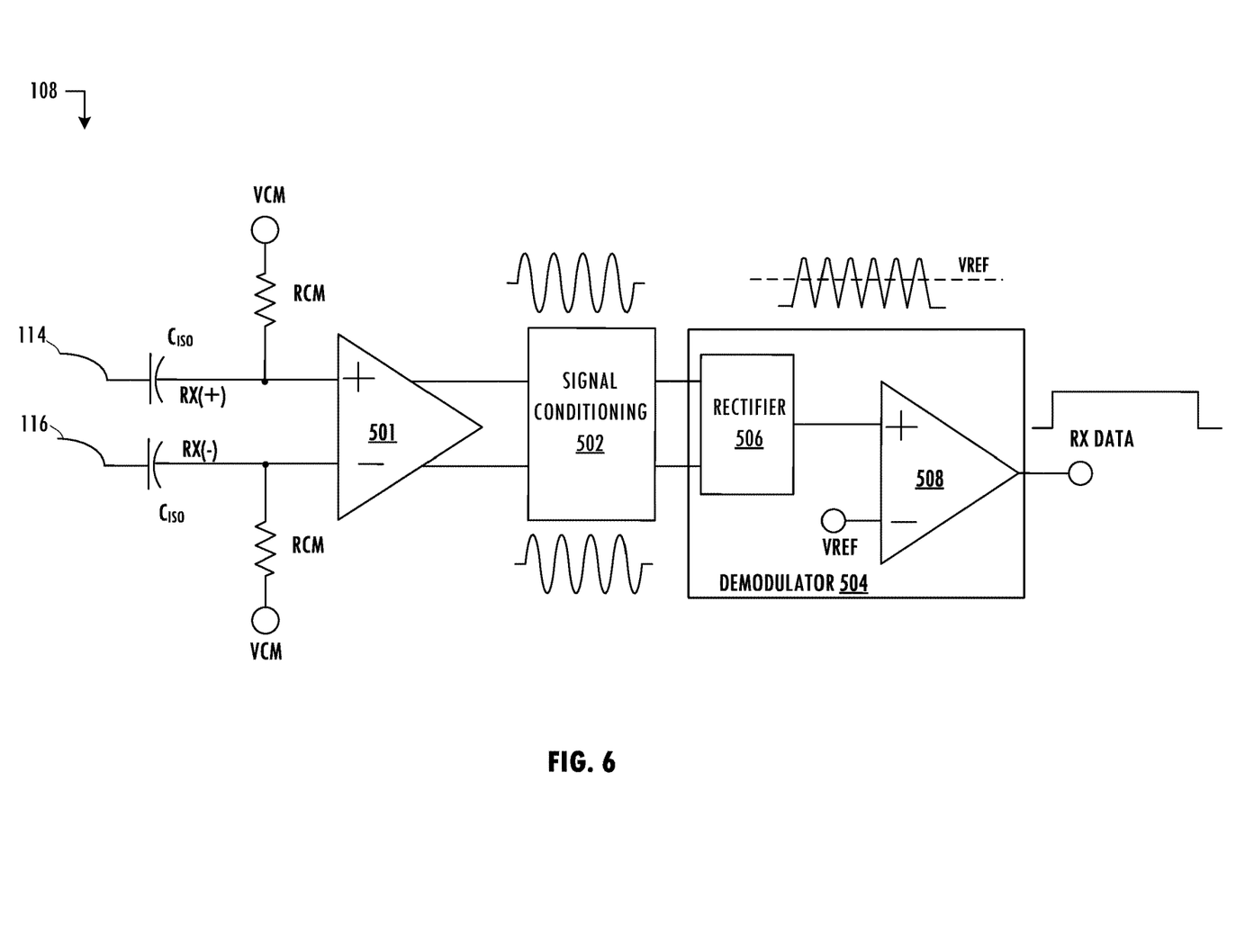
FIG. 6 illustrates a functional block diagram of a differential receive path of a receiver of the integrated circuit system of FIG. 2.

Transmitter circuit 106 receives DATA asynchronously to an internal clock and generates an on-off keying modulated representation of the digital signal by providing a signal that oscillates when DATA has a first value (e.g., a high value, i.e., a signal level indicating a digital '1') and is constant when DATA has a second value (e.g., a low value, i.e., a signal level indicating a digital '0'). Referring to FIGS. 3 and 4, a typical technique generates that representation of DATA using a logical AND of carrier clock signal CLK with the digital signal, DATA. Carrier clock signal CLK has the carrier frequency $f_c$ that is much greater than a frequency associated with DATA. By driving a differential signal representing DATA on a capacitively coupled conductor of isolation channel 120, transmitter circuit 106 provides receiver circuit 108 with a representation of DATA. Referring to FIGS. 5 and 6, receiver circuit 108 includes receiver circuitry that may amplify a received differential signal and demodulates the digital differential signal to generate recovered digital signal RX DATA, which is a recovered version of DATA. In at least one embodiment, receiver circuit 108 includes low-noise amplifier 501 coupled in series with signal conditioning circuit 502 and demodulator 504. Demodulator 504 includes rectifier 506, which generates a full-wave-rectified (FWR) signal and removes the carrier signal to provide a root mean square (RMS) proportional signal, and comparator 508, which resolves the RMS output of rectifier 506 into the recovered digital signal RX DATA.

Figure 7A:
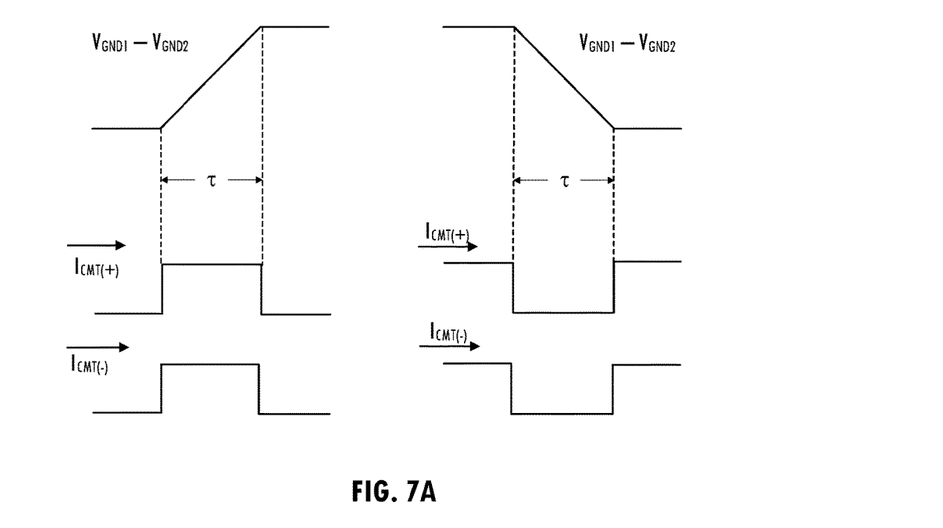
FIG. 7A illustrates voltage domain relationships and exemplary common mode transient events of the integrated circuit system of FIG. 2.
Figure 7B:
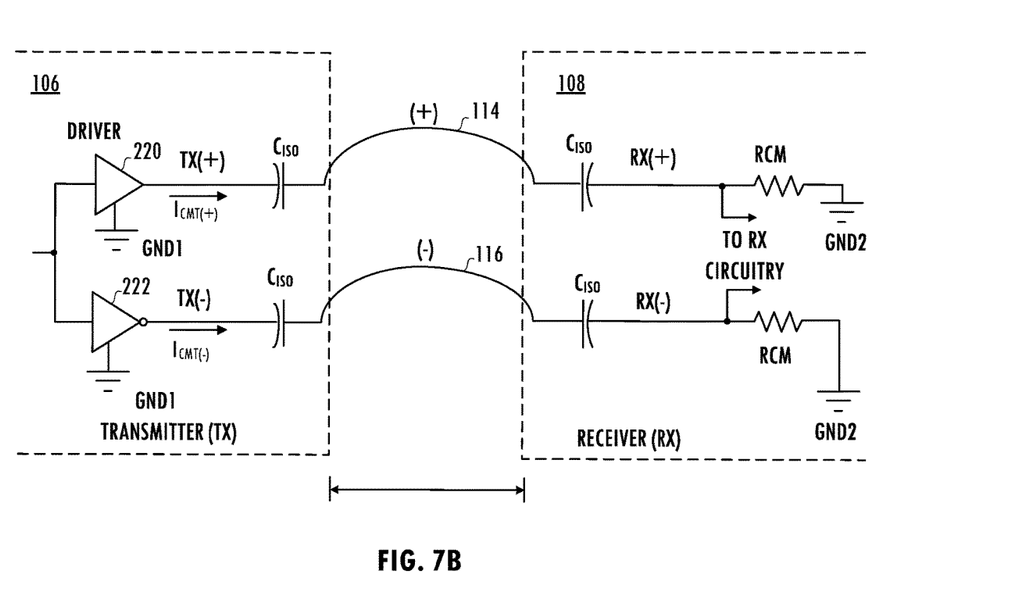
FIG. 7B illustrates a common mode transient current of the integrated circuit system of FIG. 2.

Transients caused by relative differences between the ground of transmitter circuit 106 (GND1) relative to the second ground of receiver circuit 108 (GND2) are referred to as common mode transient events. A substantial common mode transient current $I_{CMT}$ flows through the isolation barrier capacitors $C_{ISO}$, as illustrated by FIGS. 7A and 7B. Ideally, circuit components are perfectly matched and the common mode transient current does not cause a differential event between terminals RX(+) and RX(-). However, in practice, mismatch of actual circuit elements in the differential path and other factors cause the common mode transient current to generate a differential pulse at the input of receiver circuit 108. That differential pulse can corrupt the recovered digital signal RX DATA. Receiver circuits that implement techniques to reduce or eliminate such differential pulses and the associated data corruption are considered to have common mode transient immunity.

Conventional common mode transient suppression techniques use deglitching techniques that introduce substantial delay (e.g., a delay that is equal to a deglitching time $T_D$) into the receiver signal path. Deglitching circuits can suppress only common mode transient events that are faster than deglitching time $T_D$ (i.e., common mode transient events that have an event duration (e.g., pulse width) less than $T_D$ of the deglitching circuit). Typically, deglitching circuits are tailored to target events having particular durations. Thus, a design may include multiple deglitching circuits or a programmable deglitching circuit that is configured for a target application during characterization and production testing. Those conventional techniques cause gaps in the range of common mode transient suppression, leaving the system vulnerable to fault conditions. In addition, some applications cannot tolerate the additional propagation delay introduced by one or more deglitching circuits (e.g., high-rate data transfer applications in which added propagation delay effectively reduces the data rate, and half and full bridge power stages for power and audio applications in which added propagation delay may require increased dead times that negatively impact performance of those power stages).

Figure 8:
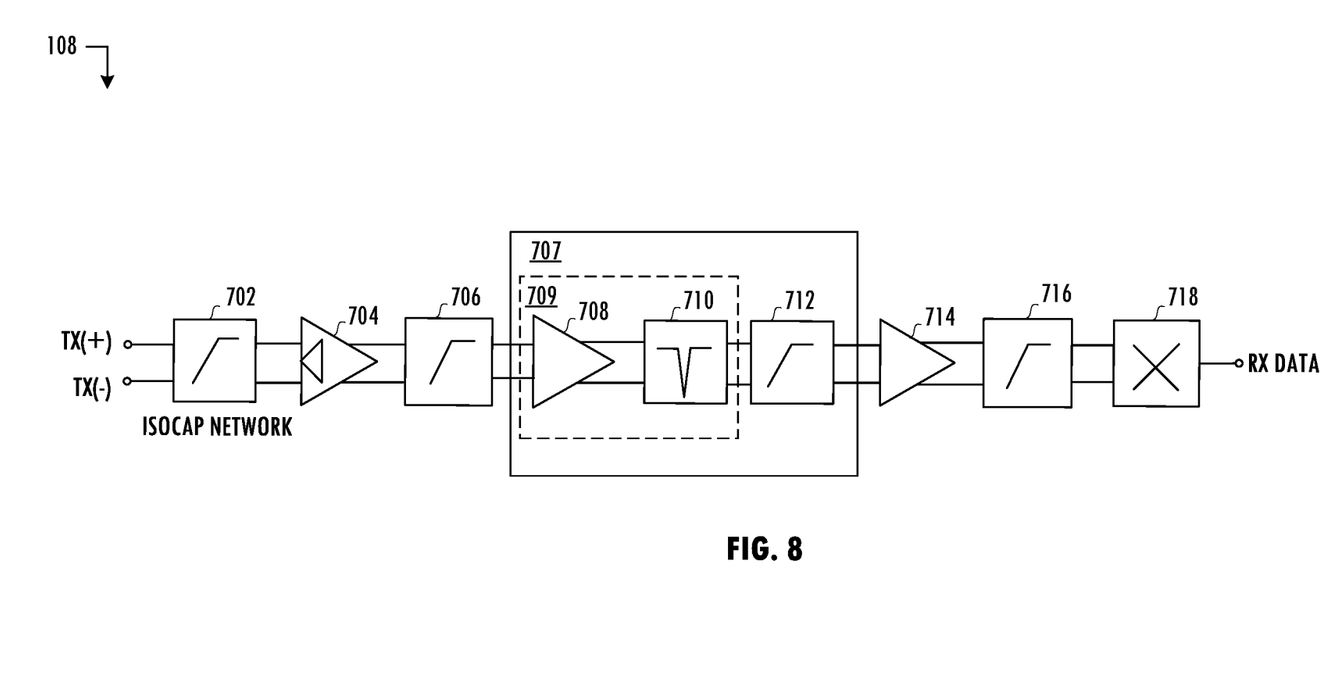
FIG. 8 illustrates a functional block diagram of an exemplary differential receiver circuit consistent with at least one embodiment of the invention.

Referring to FIG. 8, in at least one embodiment, receiver circuit 108 includes high pass filter 702 that is formed from the isolator capacitor network and a differential input stage. In addition, the receiver signal path includes current input gain stage 704 and high pass filter 706, which is coupled to transient suppression circuit 707. After common mode transient attenuation by transient suppression circuit 707, gain stage 714 amplifies the signal and high pass filter 716 attenuates any low frequency noise or disturbance introduced by gain stage 714 or any of the preceding stages. Demodulator 718 recovers the transmitted digital signal as recovered digital signal RX DATA. Transient suppression circuit 707 includes band-stop filter 709 cascaded with high pass filter 712. Band-stop filter 709 passes most frequencies unaltered, but attenuates frequencies in a specific range (e.g., a frequency range of one to two decades of frequency) to very low levels. In at least one embodiment, band-stop filter 709 is implemented using passive circuit elements including a high Q inductor. However, high Q inductors for filtering applications are difficult to manufacture and integrate on a substrate using conventional semiconductor technologies and discrete high Q inductor implementations can substantially increase the cost of receiver circuit 108. In at least one embodiment, band-stop filter 709 is integrated with other circuits on a substrate by implementing band-stop filter 709 using buffer 708 cascaded with notch filter 710.

In at least one embodiment, transient suppression circuit 707 includes buffer 708 cascaded with notch filter 710 to form band-stop filter 709 that attenuates common mode transient frequency content in frequency band $f_{SB}$ (e.g., 20-40 MHz) around notch frequency $f_n$ of notch filter 710. Buffer 708 isolates notch filter 710 from the preceding stage (e.g., high pass filter 706) and appears to notch filter 710 as a low-impedance source having a bandwidth much greater than the frequency range of attenuation of band-stop filter 709. In at least one embodiment, notch filter 710 has a stop band of approximately $f_n/k \leq f \leq (2 \times k \times f_n)$, where k is a scaling factor (e.g., $1 \leq k \leq \sqrt{5}+2$). In at least one embodiment, an effective stop band of notch filter 710 is approximately $0.5 \times f_n \leq f \leq (2 \times f_n)$. Notch filter 710 is a high quality factor (i.e., high-Q, e.g., Q=4) filter having a narrow stopband. Band-stop filter 709 attenuates common mode transient pulses having pulse widths of approximately 25 ns to 50 ns. High pass filter 712 attenuates common mode transient energy in a frequency band below carrier frequency $f_c$, which is above the notch frequency $f_n$, and outside $f_{SB}$. Accordingly, 90% of common mode transient energy is contained in the frequency band below the notch frequency and is within the stopbands of band-stop filter 709 and high pass filter 712.

Figure 9:
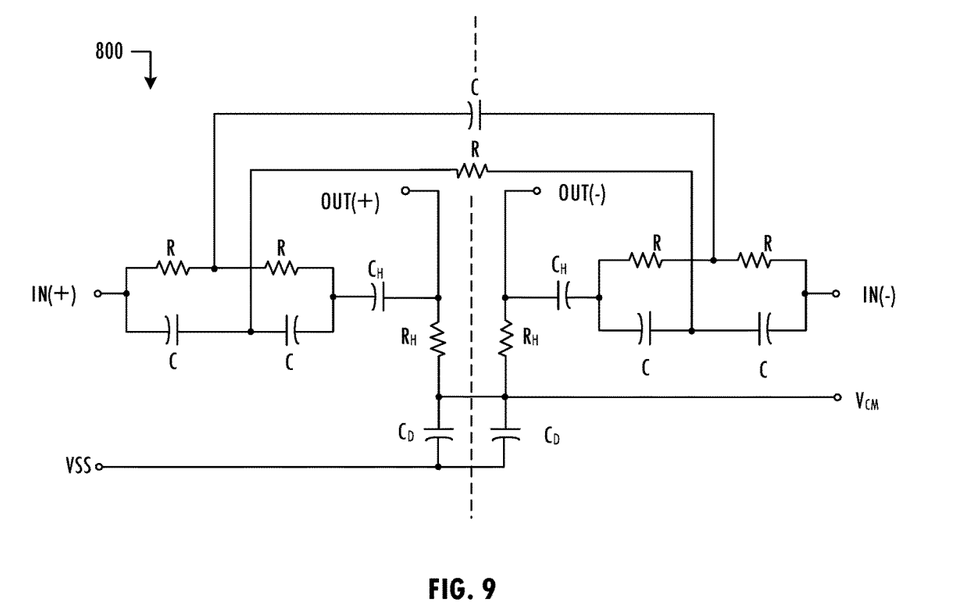
FIG. 9 illustrates an exemplary embodiment of a combined notch filter and high pass filter of FIG. 8, consistent with at least one embodiment of the invention.
Figure 10:
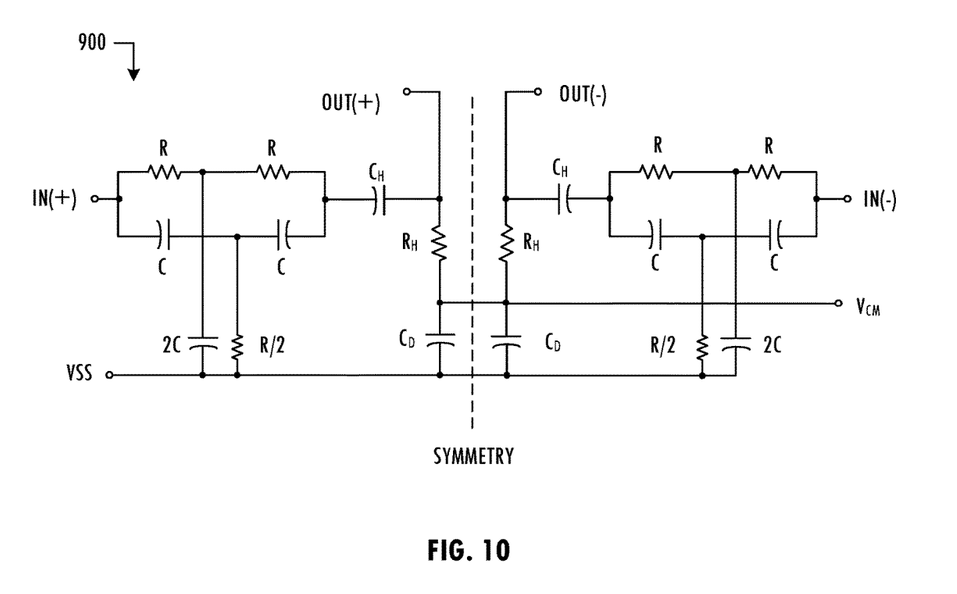
FIG. 10 illustrates an exemplary embodiment of a combined notch filter and high pass filter of FIG. 8, consistent with at least one embodiment of the invention.

Referring to FIGS. 9 and 10, exemplary embodiments of notch filter 710 use resistors R and capacitors C and produce a filter having notch frequency $$f_n = \frac{1}{2\pi RC}.$$

That passive filter is coupled to high pass filter 712, which is implemented using a network of resistors $R_H$ and capacitors $C_H$. Biasing signal $V_{CM}$ has a voltage at approximately mid-range of the power supply voltage. Decoupling capacitors CD located between node $V_{CM}$ and ground have capacitance values that provide an AC ground at high frequencies (e.g., frequencies above several tens of MHz) or otherwise make node $V_{CM}$ appear as an AC ground for the entire frequency range of $0 < f < f_c$. The symmetrical nature of circuits 800 and 900 improves power-supply rejection and reduces offset voltages under some circumstances. Circuit 900 uses a T-notch filter configuration that replaces the differential bridge resistor and capacitor (R and C) between the positive and negative sides of circuit 800 with equivalent single-ended components of R/2 and 2C connected to ground.

Figure 11:
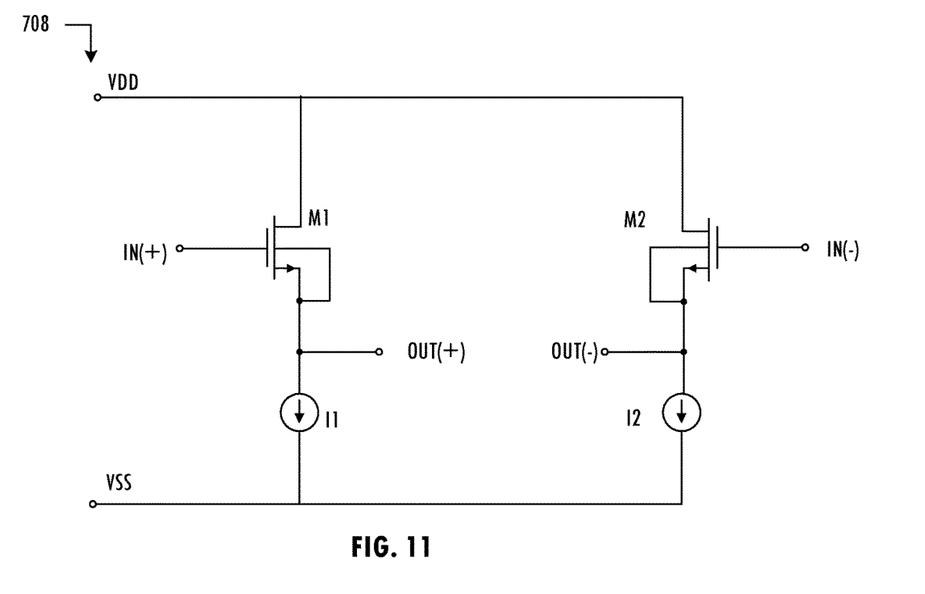
FIG. 11 illustrates an exemplary embodiment of buffer circuit of FIG. 8, consistent with at least one embodiment of the invention.
Figure 12:
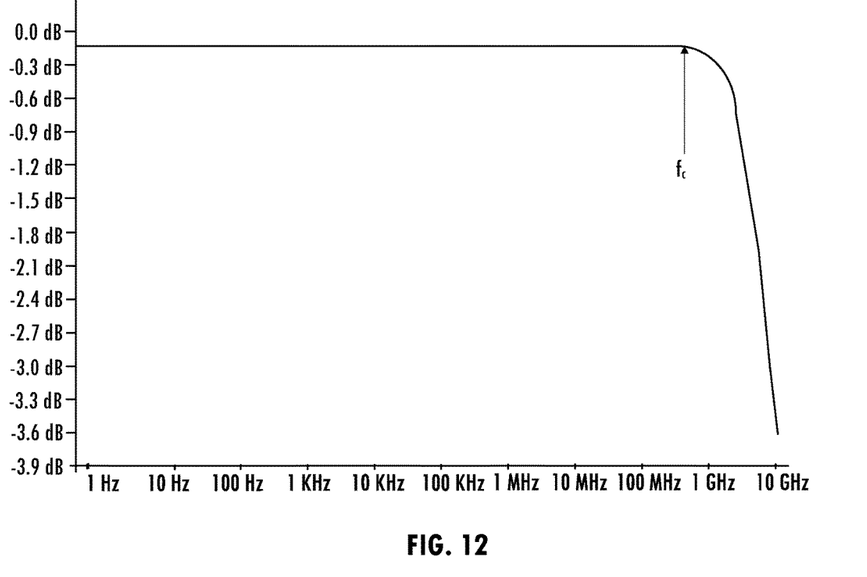
FIG. 12 illustrates a frequency response of the exemplary buffer circuit of FIG. 11.
Figure 13:
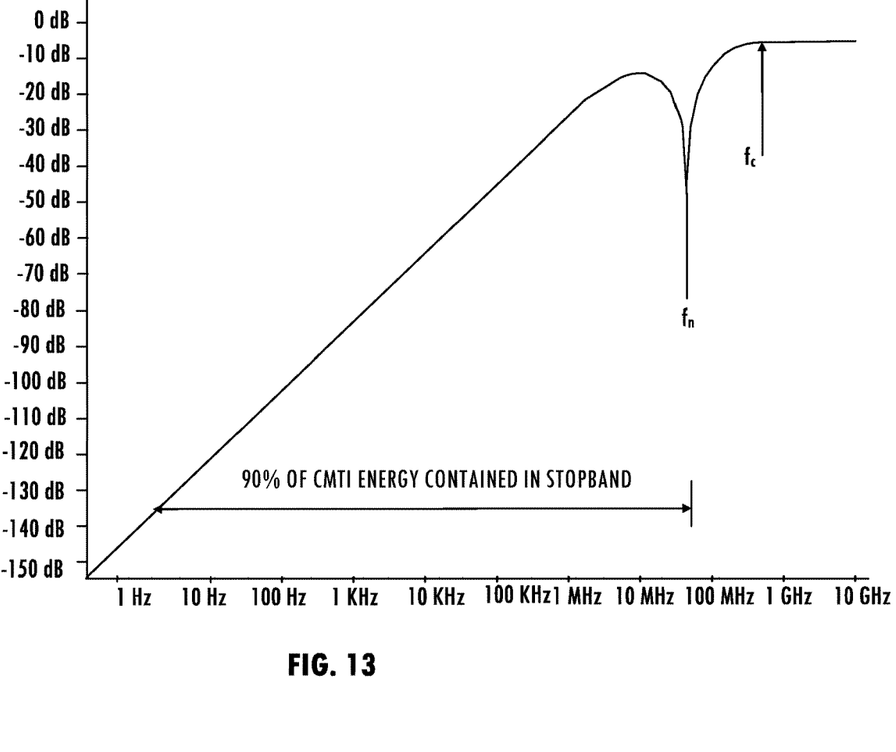
FIG. 13 illustrates an exemplary embodiment of a transient suppression circuit of FIG. 8 and associated frequency response consistent with at least one embodiment of the invention.

Referring to FIGS. 8, 11, and 12, an exemplary implementation of buffer circuit 708 includes a simple source follower stage, where M1=M2 and $I1=I2=I_{FLWR}$. Source follower current $I_{FLWR}$ is chosen to cause a flat band of the source follower frequency response to extend to (or slightly beyond) carrier frequency $f_c$ to reduce attenuation of the useful signal by circuit 708. FIG. 12 illustrates the corresponding frequency response. FIG. 13 illustrates the frequency response of transient suppression circuit 707. Notch filter 710 provides a steep recovery of gain beyond the stopband, which reduces attenuation of useful signal. For long common mode transient events, approximately 90% of the common mode transient pulse energy is included in the stopband, i.e., the frequency band of frequencies below the notch frequency $f_n$.

Figure 14:
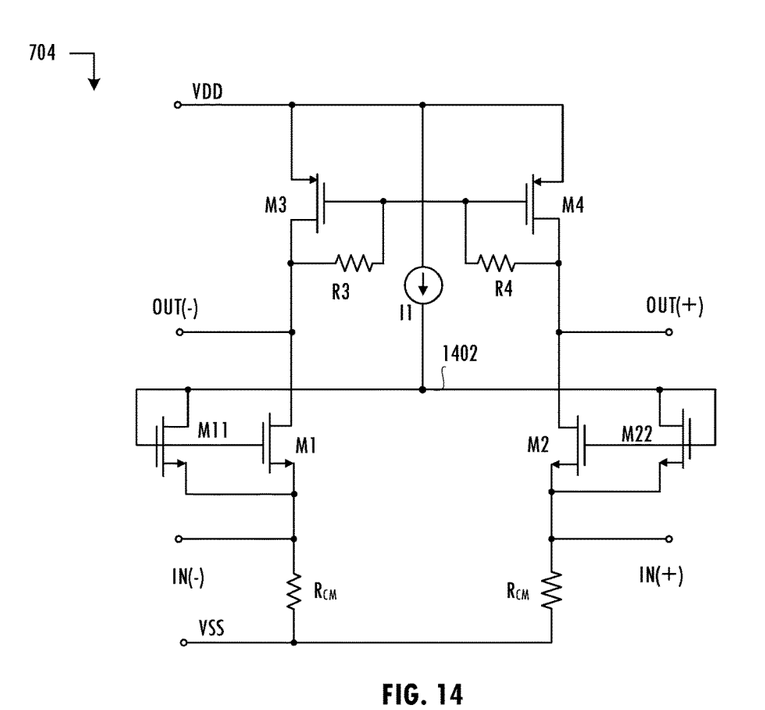
FIG. 14 illustrates an exemplary embodiment of a current input gain stage of FIG. 8, consistent with at least one embodiment of the invention.

FIG. 14 illustrates an exemplary embodiment of current input gain stage 704, which includes a common gate differential stage and has a low input impedance. Transistors M1 and M2 are configured as a differential pair of transistors. Transistors M3 and M4 and resistors R3 and R4 implement a differential diode load. A tail current source I1 and the shared gate of transistors M1, M2, M11, and M22 establish a virtual ground at tail node 1402, allowing the voltages on the input common mode voltage and the virtual ground node voltage to float up or down resulting in a fixed gain and improved common mode rejection as compared to other input gain stage topologies.

Figure 15:
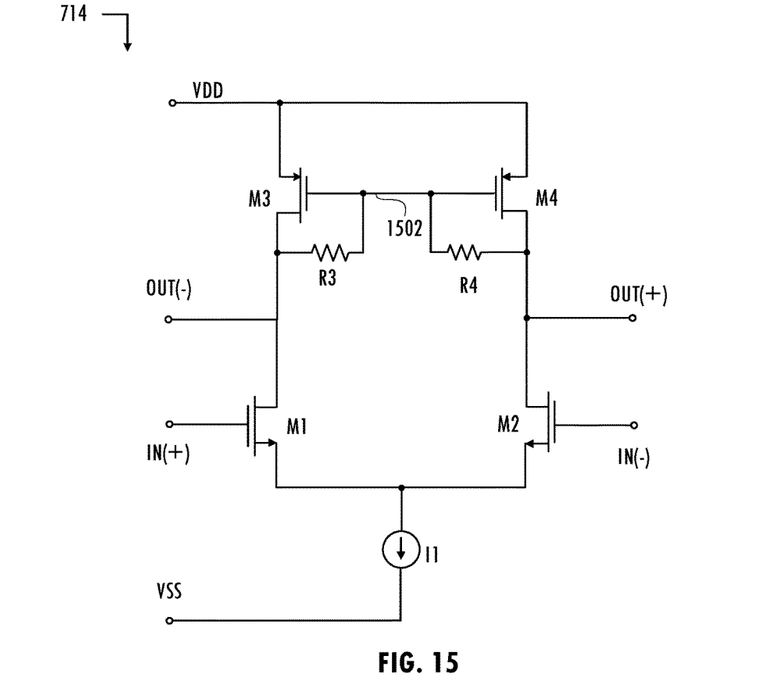
FIG. 15 illustrates an exemplary embodiment of a gain stage of FIG. 8, consistent with at least one embodiment of the invention.

FIG. 15 illustrates an exemplary embodiment of gain stage 714 that includes a common source differential stage. Transistors M1 and M2 are configured as a differential pair of transistors. Transistors M3 and M4 and resistors R3 and R4 implement a differential diode load. Resistors R3 and R4 reduce the gain at low frequencies, reduce the gain change over the frequency range, and reduce the need for common mode feedback circuitry. The DC common mode voltage of the output signal $V_{CM}$ is equal to the voltage level on node 1502 and is approximately equal to the supply voltage $V_{DD}$ less $|V_{tp}+V_{dsat}|$ of transistors M3 and M4.

Figure 16:
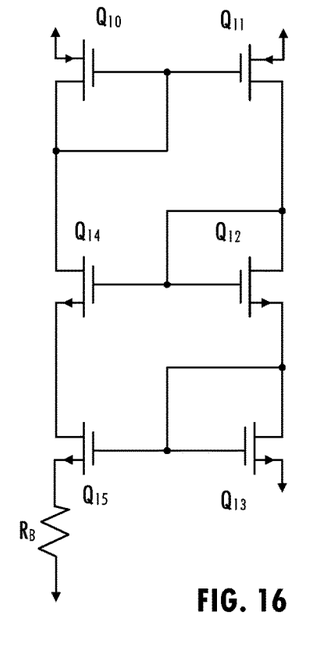
FIG. 16 illustrates an exemplary embodiment of a constant transconductance (i.e., constant $g_m$) of FIGS. 14 and 15.

An exemplary current source using a constant $g_m$-biasing technique is illustrated in FIG. 16. Transistors $Q_{15}$ and $Q_{13}$ are four times the size of devices $Q_{10}$, $Q_{11}$, $Q_{12}$, and $Q_{14}$. The value of transconductance $g_m$ is 1/RB. By using constant $g_m$-biasing over temperature to implement the tail current sources of circuits of FIGS. 14 and 15, those circuits are substantially independent of variations in process, voltage, and temperature.

Figure 17:
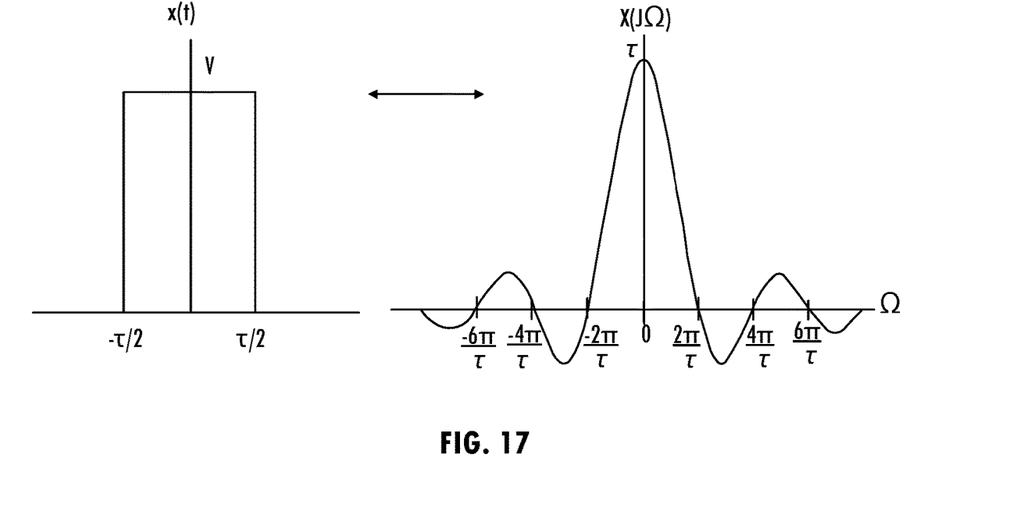
FIG. 17 illustrates an exemplary signal waveform and associated frequency response of a common mode transient pulse.

FIG. 17 illustrates Fourier analysis of an exemplary common mode transient pulse. The common mode transient pulse appears as a differential pulse at the input of the differential receiver signal path and is modeled as a rectangular function of time, where rect(t)=0 if $|t|>\tau/2$ and rect(t)=V if $|t|<\tau/2$. The amplitude V of the function is linearly related to $\Delta V$, and the time constant $\tau$ is linearly related to the duration of the common mode transient event, where $\Delta V$ is $V_{GND1}-V_{GND2}$ during the common mode transient event, and $\tau$ is the time of the common mode transient event. A substantial portion of the common mode transient event energy is contained in frequencies $f<1/\tau$. For a particular $\Delta V/\Delta t$ rate, a fast common mode transient pulse with a short duration and small amplitude has a wider spectrum (e.g., a wider sinc function), but couples less energy into the signal path. A longer common mode transient pulse has a larger amplitude and a narrower spectrum and couples in more energy into the receiver signal path. Having a notch filter with notch frequency $f_n$ as close as possible to $1/\tau$ in addition to cascaded high pass filters in the receiver signal path will attenuate most of the common mode transient energy below for larger common mode transient events (e.g., 1500V in 15 ns). The faster common mode transient events may pass through the notch filter and high pass filter cascade with less attenuation, but those events contain less energy and thus are less likely to corrupt data in recovered digital signal RX DATA. The notch filter and high pass filter cascade of FIG. 8 attenuates more of the common mode transient event than it attenuates useful signal around carrier frequency $f_c$, thereby improving common mode transient immunity and reducing the need for deglitch circuits that increase propagation delay in the receiver signal path.

Figure 18:
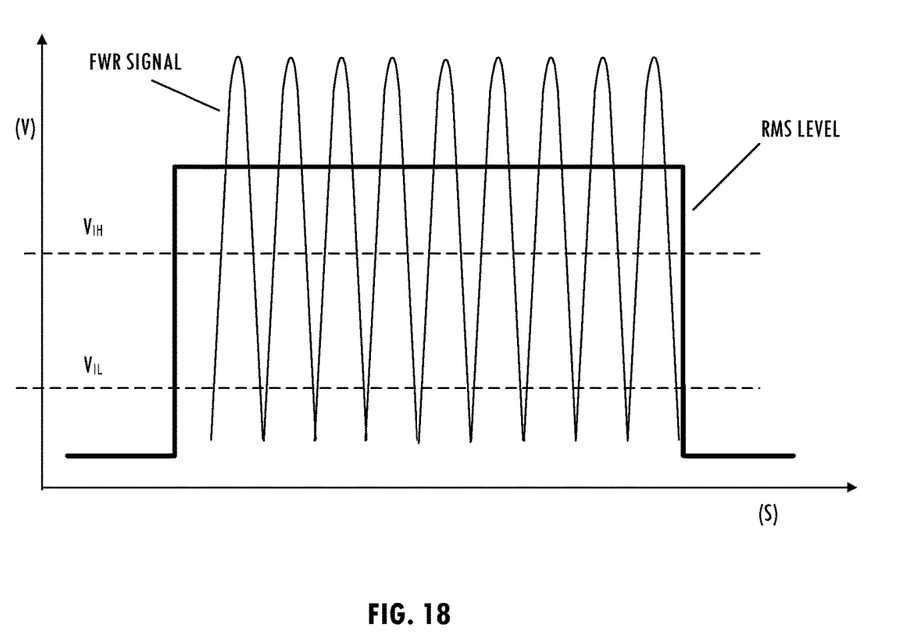
FIG. 18 illustrates exemplary waveforms of an input signal and an output signal of a demodulator of FIG. 8 consistent with at least one embodiment of the invention.

Referring to FIGS. 8 and 18, in at least one embodiment, demodulator 718 removes the carrier wave from the output of high pass filter 716 to generate recovered digital signal RX DATA. Demodulator 718 performs full-wave rectification of the received signal, and then recovers the digital information using predetermined hysteretic thresholds $V_{IH}$ and $V_{IL}$ that also further attenuate and/or filter out common mode transient events. For example, demodulator 718 includes a comparator with hysteresis. Demodulator 718 implements precise thresholds for rectifying the signal and resolving the digital information. An RMS level that transitions higher than $V_{IH}$ results in a high voltage output corresponding to a digital logic high signal and an RMS voltage level that transitions below $V_{IL}$, results in a low voltage output corresponding to a digital logic low signal. The hysteretic thresholds provide additional noise immunity to high frequency, low energy events. In at least one embodiment, demodulator 718 includes a full-wave rectifier coupled in series with an RMS-proportional signal generator, which is coupled in series with a hysteretic comparator. However, in other embodiments, the signal rectification and RMS-proportional signal generation are performed by one circuit that is coupled in series with a hysteretic comparator.

Thus, techniques for improving common mode transient immunity of a differential receiver circuit have been disclosed. The resulting receiver path has fewer gaps in the common mode transient suppression of the receiver path frequency response than conventional techniques that use deglitching circuitry. In addition, the resulting receiver paths have less propagation delay than the conventional techniques and any propagation delay is independent of the pulse width of common mode transient events being rejected.

The description of the invention set forth herein is illustrative, and is not intended to limit the scope of the invention as set forth in the following claims. For example, while the invention has been described in embodiments in which capacitive isolation channels are used, one of skill in the art will appreciate that the teachings herein can be utilized with other isolation channel implementations. Variations and modifications of the embodiments disclosed herein, may be made based on the description set forth herein, without departing from the scope and spirit of the invention as set forth in the following claims.

What is claimed is:

1. A differential receiver circuit comprising:
   a band-stop filter having a stopband $f_{SB}$ around a notch frequency $f_n$; and
   a first high-pass filter coupled in series with the band-stop filter, the notch frequency $f_n$ being less than a carrier frequency $f_c$ of a received signal received by the differential receiver circuit,
   wherein the differential receiver circuit is configured to receive the received signal from a differential transmitter via an isolation barrier, the differential receiver circuit having a first voltage domain and the differential transmitter having a second voltage domain.

2. The differential receiver circuit, as recited in claim 1, wherein the band-stop filter comprises:
   a buffer circuit; and
   a notch filter coupled in series with the buffer circuit, the notch filter having a stopband around the notch frequency $f_n$.

3. The differential receiver circuit, as recited in claim 1, wherein the band-stop filter comprises: a passive T-notch filter of resistors having resistance R and capacitors having capacitance C, wherein the notch frequency $$f_n \text{ is } \frac{1}{2\pi RC}.$$

4. The differential receiver circuit, as recited in claim 1, wherein the notch frequency $f_n$ is approximately 30 MHz, the stopband $f_{SB}$ is approximately 20 MHz≤$f_{SB}$≤40 MHz, and the differential receiver circuit is configured to attenuate a common mode transient pulse having a pulse width $\tau_{CMT}$ in a range of approximately 25 ns≤$\tau_{CMT}$≤50 ns.

5. The differential receiver circuit, as recited in claim 1, further comprising:
   an input stage having a low input impedance, the input stage comprising a common gate differential circuit having a virtual ground at a tail node; and
   a second high-pass filter coupled in series with the input stage and the band-stop filter.

6. The differential receiver circuit, as recited in claim 5, further comprising:
   an intermediate gain stage coupled in series with the band-stop filter, the intermediate gain stage comprising a common source differential circuit; and
   a third high pass filter coupled in series with the intermediate gain stage.

7. The differential receiver circuit, as recited in claim 6, further comprising:
   a demodulator coupled in series with the third high pass filter, the demodulator being configured to remove a carrier wave from an output of the third high pass filter and generate a recovered digital signal using hysteretic thresholds.

8. The differential receiver circuit, as recited in claim 7, wherein the demodulator is configured for full-wave rectification of the received signal.

9. The differential receiver circuit, as recited in claim 1, wherein the differential receiver circuit has a propagation delay independent of a pulse width of common mode transient energy attenuated by the differential receiver circuit.

10. A method of receiving a signal comprising:
    band-stop filtering a first version of a received signal to attenuate energy in a stopband $f_{SB}$ around a notch frequency $f_n$; and
    high-pass filtering a second version of the received signal to attenuate energy below a carrier frequency $f_c$ of the received signal, the carrier frequency $f_c$ being higher than the notch frequency $f_n$,
    wherein the method of receiving has a propagation delay independent of events being attenuated.

11. The method, as recited in claim 10, wherein the band-stop filtering comprises:
    buffering and notch filtering the first version of the received signal, the notch filtering attenuating energy in a second stopband around the notch frequency $f_n$.

12. The method, as recited in claim 10, wherein the notch frequency $f_n$ is approximately 30 MHz, the stopband $f_{SB}$ is approximately 20 MHz≤$f_{SB}$≤40 MHz, and the energy includes a pulse having a pulse width $\tau_{CMT}$ in a range of approximately 25 ns≤$\tau_{CMT}$≤50 ns.

13. The method, as recited in claim 10, further comprising:
    demodulating the received signal to generate a demodulated received signal; and
    recovering digital data from the demodulated received signal using hysteretic thresholds.

14. The method, as recited in claim 10, further comprising:
    transmitting a control signal across an isolation barrier using a transmitter having a first voltage domain; and
    receiving the control signal as the received signal by a receiver having a second voltage domain.

15. A differential receiver comprising:
    a first circuit configured to attenuate energy in a first frequency range of a frequency response of a received signal, the first frequency range being f≤$f_c$, where f is frequency and $f_c$ is a carrier frequency of the received signal;
    a second circuit coupled in series with the first circuit and configured to attenuate energy in a second frequency range of the frequency response of the received signal, the second frequency range being $f_n/k$≤f≤$(2\times k \times f_n)$, where $f_n$ is a notch frequency of a notch filter included in a band-stop filter having a stopband around the notch frequency and k is a scaling factor; and
    a third circuit coupled in series with the second circuit and configured to remove a carrier wave from an output of the second circuit and recover digital data encoded in the received signal using hysteretic thresholds.

16. The differential receiver, as recited in claim 15, wherein the second circuit includes a buffer coupled in series with the notch filter.

17. The differential receiver, as recited in claim 15, wherein the third circuit includes a demodulator configured to use the hysteretic thresholds for recovery of on-off keying modulated signals generated using the carrier wave.

18. The differential receiver, as recited in claim 15, wherein the differential receiver has a propagation delay independent of a pulse width of common mode transient energy attenuated by the differential receiver.

* * * * *

UNITED STATES PATENT AND TRADEMARK OFFICE
CERTIFICATE OF CORRECTION

PATENT NO.          : 10,397,025 B2
APPLICATION NO.     : 15/683873
DATED               : August 27, 2019
INVENTOR(S)         : Mohammad Al-Shyoukh and Stefan Mastovich Page 1 of 1

It is certified that error appears in the above-identified patent and that said Letters Patent is hereby corrected as shown below:

On the Title Page

Item (54), and in the Specification at Column 1, Line 3, please correct the title by inserting --for-- before "Common".

Signed and Sealed this
First Day of October, 2019

Andrei Iancu
*Director of the United States Patent and Trademark Office*